United States Patent [19]
Lou

[11] Patent Number: 5,827,766
[45] Date of Patent: Oct. 27, 1998

[54] METHOD FOR FABRICATING CYLINDRICAL CAPACITOR FOR A MEMORY CELL

[75] Inventor: Chine-Gie Lou, Hsinchu, Taiwan

[73] Assignee: Industrial Technology Research Institute, Hsinchu, Taiwan

[21] Appl. No.: 988,915

[22] Filed: Dec. 11, 1997

[51] Int. Cl.$^6$ ................................................ H01L 21/8242
[52] U.S. Cl. ........................... 438/253; 438/254; 438/255
[58] Field of Search ..................................... 438/250–256, 438/393–398

[56] References Cited

U.S. PATENT DOCUMENTS

| | | | |
|---|---|---|---|
| 5,235,199 | 8/1993 | Hamamoto et al. | 257/306 |
| 5,278,437 | 1/1994 | Wakamiya | 257/309 |
| 5,280,444 | 1/1994 | Motonami et al. | 365/149 |
| 5,731,130 | 3/1998 | Tseng | 438/396 |
| 5,731,808 | 3/1998 | Tseng | 438/239 |

*Primary Examiner*—Jey Tsai
*Attorney, Agent, or Firm*—George O. Saile; Stephen B. Ackerman; William J. Stoffel

[57] ABSTRACT

The present invention provides two main embodiments of a method of manufacturing a high capacitance cylindrical capacitor for a DRAM. The capacitor of the invention has a high capacitance because of the addition area 48C under the upper cylinder 48A and the hemispherical grain (HSG) layer 49 72. The first embodiment of the invention forms a HSG layer 49 over the inside of the cylindrical electrode 48A. The second embodiment forms a HSG layer 72 over both the inside and outside of the cylindrical electrode 70A. The invention also features four preferred methods for forming the first and second openings 30 34 in the second insulating layer. The first and second preferred methods use two optical masks to define the openings 30 34. The third and fourth methods use one photoresist layer 100 with 3 different thickness areas and a three step etch to define the first and second openings 30 34.

10 Claims, 8 Drawing Sheets

METHOD FOR FABRICATING CYLINDRICAL CAPACITOR FOR A MEMORY CELL

BACKGROUND OF INVENTION

1) Field of the Invention

This invention relates generally to the fabrication of semiconductor memories and particularly to dynamic random access memories (DRAMs) with cell structures and more particularly to a process of making a cylindrical capacitor over a bitline.

2) Description of the Prior Art

The development of the semiconductor industry has always followed that of the Dynamic Random Access Memory (DRAM) technology in that the DRAM development has led in the use of the highest density technology elements capable of being produced in manufacturable quantities. Proposed designs for DRAM cells in 16 MB, 64 MB and high density range have also included the use of multi-plate or stacked storage capacitor cell designs. Although the use of stacked cell technology has rendered the processing of DRAMs more complex, such techniques continue to be used extensively.

The decrease in cell capacitance caused by reduced memory cell area is a serious obstacle to increasing packing density in dynamic random access memories (DRAMs). The problem of decreased cell capacitance must be solved to achieve higher packing density in semiconductor memory devices, since decreased cell capacitance degrades read-out capability and increases the soft error rate of memory cells as well as consumes excessive power during low-voltage operation by impeding device operation.

Generally, in a 64 MB DRAM having a 1.5 $\mu m^2$ memory cell area employing an ordinary two dimensional stacked capacitor cell, sufficient cell capacitance cannot be obtained even though a higher dielectric constant material, e.g., tantalum oxide ($Ta_2O_5$), is used. Therefore, stacked capacitors having a three-dimensional structure have been suggested to improve cell capacitance. Such stacked capacitor include, for example double-stacked, fin-structured, cylindrical, spread-stacked, and box structured capacitors.

Since both outer and inner surfaces can be utilized as an effective capacitor area, the cylindrical structure is favorably suitable to the three-dimensional stacked capacitor, and is more particularly suited for an integrated memory cell which is 64 Mb or higher. Also, an improve stacked capacitor has recently been presented, where pillars or another inner cylinder is formed in the interior of the cylinder. However, even more surface area and capacitance are required to achieve higher densities.

The importance of overcoming the various deficiencies noted above is evidenced by the extensive technological development directed to the subject, as documented by the relevant patent. The closest and apparently more relevant technical developments in the patent literature can be gleaned by considering U.S. Pat. No. 5,235,199 (Hamamoto et al.) which shows a memory with a pad electrode and a bit line under a stacked capacitor. Also, U.S. Pat. No. 5,280,444 (Motonami et al.) shows a stacked capacitor having a vertically protruding part. U.S. Pat. No. 5,278,437 (Wakamiya et al.) shows another method for a stack capacitor.

There is a challenge to develop methods of manufacturing these capacitors that minimize the manufacturing costs and maximize the device yields. In particular, there is a challenge to develop a method which minimizes the number of photoresist masking operations and provides maximum process tolerance to maximize product yields. There is also a challenge to develop a coaxial capacitor which is easy to manufacture.

SUMMARY OF THE INVENTION

It is an object of the present invention to provide a simplified method for fabricating a cylindrical capacitor of a semiconductor memory device, which ensures high reliability and large cell capacitance of the memory device.

It is another object of the present invention to provide a novel method for fabricating a cylindrical capacitor which increases yields by increasing the process tolerances, ensures high reliability, and increases the capacitance of the capacitor.

It is another object of the present invention to provide a novel method for fabricating a cylindrical capacitor which uses one photoresist layer and a three step etch process to define the cylinder portion of the bottom electrode.

To accomplish the above objectives, the present invention provides two embodiments of a method of manufacturing a high capacitance cylindrical capacitor for a DRAM. The first embodiment (See FIG. 1D) forms a cylindrical capacitor with HSG layer 49 over the inside surface of the cylinder 48A. The second embodiment forms a HSG layer 72 over both the inside and outside of the cylinder 70A (See FIG. 2D). The capacitor of the invention has a high capacitance because of the addition area 48C under the upper cylinder 48A (See FIG. 1D) and because of the HSG layers 49 72. In addition, the invention provides 4 preferred methods for forming the first and second openings 30 34 in the first insulating layer that define the cylinder 48A 70A.

The first preferred embodiment of the invention (e.g. HSG layer 49 inside of capacitor cylinder 48A) comprises the following steps:

a) See FIG. 1A—forming first insulating layer 14 over a substrate;

b) chemical-mechanical polishing the first insulating layer 14 for global planarization;

c) forming a first barrier layer 18 composed of silicon nitride over the first insulating layer 14;

d) forming a contact opening 20 through the first insulating layer 14 and the first barrier layer 18 exposing the substrate surface;

e) filling the contact opening 20 and covering the first barrier layer 18 with a conductive material preferably comprised of tungsten;

f) removing the conductive material over the first barrier layer 18 forming a plug 24 in the contact opening; the removal of the conductive material performed using a chemical-mechanical polish process;

g) forming a second insulating layer 26 over the first barrier layer 18 h) FIG. 1B—forming a first opening 30 and a second opening 34 in the second insulating layer, the first opening 30 having a larger open dimension than the second opening 34; the second opening exposing the plug 24;

i) FIG. 1C—forming a polysilicon layer 48 over the second insulating layer, and over the plug 24; the polysilicon layer 48 preferably composed of insitu doped polysilicon;

j) forming a hemispherical grain film (HSG) 49 over the polysilicon layer 48;

k) removing the polysilicon layer 48 and the HSG layer 49 over the second insulating layer; the removal of the polysilicon layer 48 performed with a chemical-mechanical polish;

l) FIG. 1D—selectively etching and removing the second insulating layer 26 thereby forming a cylindrical top 48A; a cylindrical bottom electrode is comprised of the cylindrical top 48A and the plug 24;

m) FIG. 1D—forming a capacitor dielectric layer 60 over the cylindrical top;

n) forming a top electrode 64 over the capacitor dielectric layer 60.

The second preferred embodiment (HSG layer 72 on both the inside and outside of the cylinder 70A) that uses comprises the following steps:

a) FIG. 1A—forming first insulating layer 14 over the substrate;

b) chemical-mechanical polishing the first insulating layer 14 for global planarization;

c) forming a first barrier layer 18 composed of silicon nitride over the first insulating layer 14;

d) forming a contact opening 20 through the first insulating layer 14 and the first barrier layer 18 exposing the substrate surface;

e) filling the contact opening 20 and covering the first barrier layer 18 with a conductive material comprising insitu doped polysilicon;

f) removing the conductive material over the first barrier layer 18 forming a plug 24 in the contact opening; the removal of the conductive material performed using a chemical-mechanical polish process;

g) forming a second insulating layer 26 over the first barrier layer 18;

h) FIG. 1B—forming a first opening 30 and a second opening 34 in the second insulating layer 26, the first opening 30 having a larger open dimension than the second opening 34; the second opening exposing the plug 24;

i) FIG. 2A—forming a polysilicon layer 70 over the second insulating layer 26 and over the plug 24; the polysilicon layer 70 composed of insitu doped polysilicon;

j) chemical-mechanical polishing and removing the polysilicon layer 70 over the second insulating layer 26;

k) FIG. 2B—selectively etching and removing the second insulating layer 26 thereby forming a cylindrical top 70A;

l) FIG. 2C—forming a hemispherical grain layer (HSG) 72 over the cylindrical top 70A and the first barrier layer 18;

m) FIG. 2D—etching back the hemispherical grain layer (HSG) 72 using a reactive ion etch at least removing the hemispherical grain layer (HSG) from over the first barrier layer 18; a cylindrical bottom electrode is comprised of the cylindrical top 70A, the hemispherical grain layer (HSG) 72 and the plug 24;

n) forming a capacitor dielectric layer 60 over the cylindrical top 70A;

o) FIG. 2D—forming a top electrode 64 at least over the capacitor dielectric layer 60.

There are four preferred methods (options) of defining the first and second openings 30 34 in the second insulating layer. The first and second methods use two photoresist/masks. The third and fourth methods use only one photoresist layer to define the invention's cylindrical capacitor. Both the third and fourth methods form a 3 level (thickness) photoresist layer that has 3 different thickness areas, (1) full thickness (2) intermediate thickness and (3) no thickness (open). The 3 level photoresist 100 is used with a three step etch process to define the bottom electrode.

The third method for forming the first and second openings uses a half tone optical mask to define the 3 level photoresist 100. The fourth method forms the 3 level photoresist layer 100 using a e-beam process by exposing the photoresist layer to varying doses from an e-beam lithography tool.

The method of the present invention provides a high capacitance cylindrical capacitor. The capacitor has a higher capacitor especially because of the additional cylindrical area 48C under the upper cylinder 48A (see FIG. 1D) and because of the increased surface area of the HSG layer 72 49.

The two preferred embodiments of the invention provide a method to produce a cylindrical capacitor which increases yields and insures high reliability. The capacitor is easier to manufacture because the process tolerances are increased.

The third and fourth preferred method to form the first and second openings 30 34 use only one photoresist layer to define the invention's cylindrical capacitor. The 3 level photoresist layer 100 is used with a three step etch process to define the cylinder portion 48A of the bottom electrode. The one photoresist layer 100 reduces processing costs and eliminates masking operations used in conventional capacitor processes.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

The present invention will be described in detail with reference to the accompanying drawings. The present invention provides a method of forming a DRAM having a cylindrical capacitor which has small dimension, high capacitance and is simple to manufacture. The invention has 2 preferred embodiments for the cylindrical capacitor 48A 70A and 4 preferred methods of forming the first and second openings 30 34. See tables below.

TABLE 1

Two Embodiments Of For Forming The Cylindrical Capacitor Of The Invention.

| Embodiment | Remarks | FIGS. |
|---|---|---|
| 1 | HSG layer 49 formed on inside of cylindrical electrode 48A | FIGS. 1A to 1D |
| 2 | HSG layer 72 formed on both inside and outside of cylindrical electrode 70A | FIGS. 2A to 2D |

TABLE 2

4 Preferred Methods For Forming The First And Second Openings 30 34

Figure 2A:
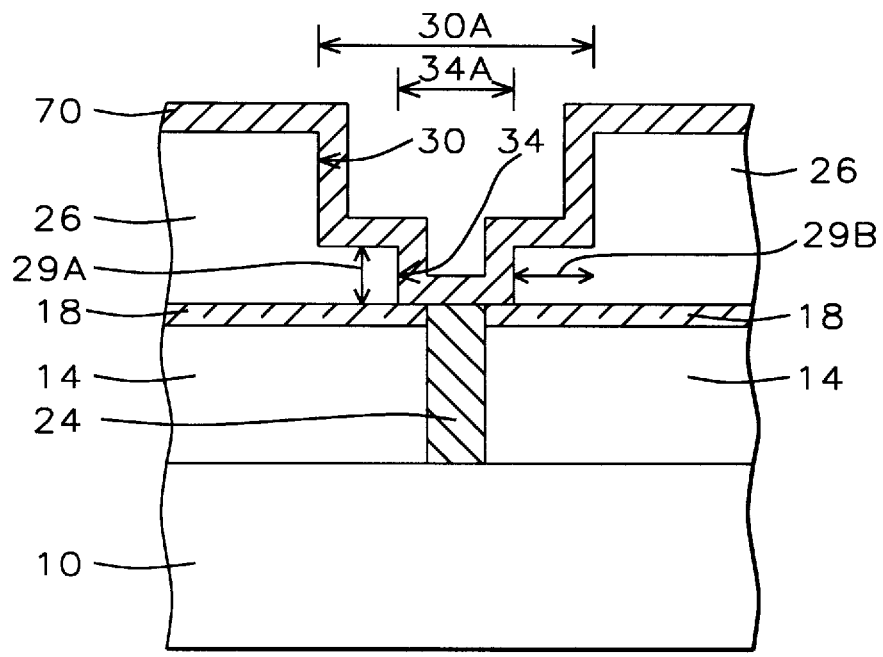
FIGS. 2A through 2D are cross sectional views for illustrating a second embodiment for manufacturing cylindrical capacitor according to the present invention.
Figure 2B:
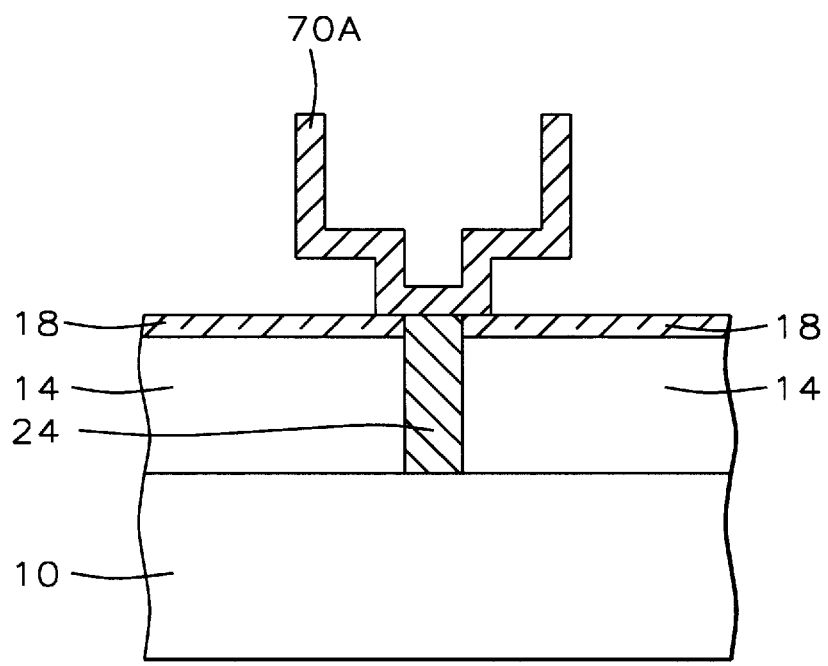
Figure 2C:
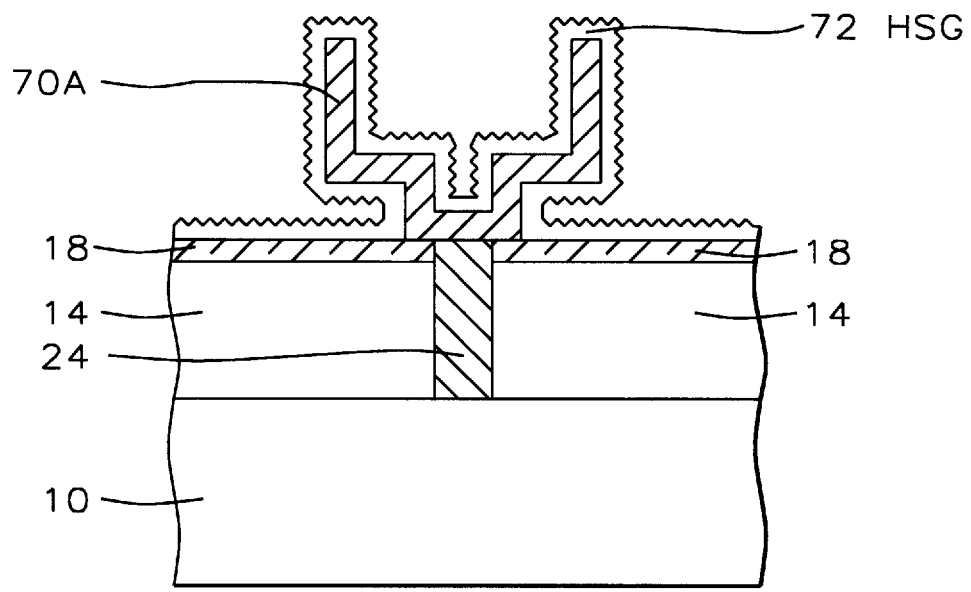
Figure 2D:
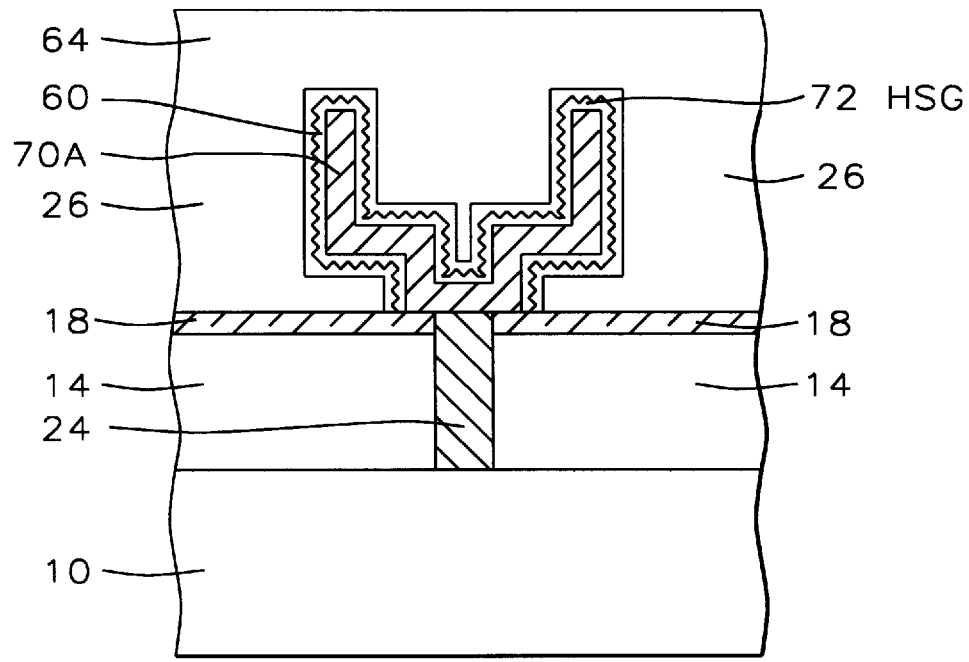
Figure 2E:
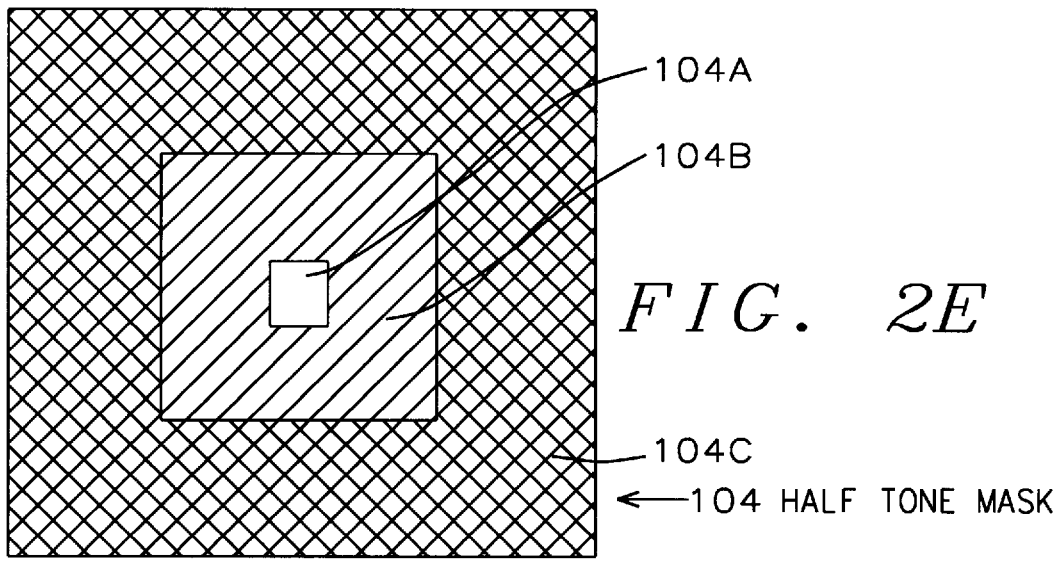
FIG. 2E is a top down view of a half tone optical mask used to form the first and second openings 30 34 of the present invention.
Figure 2F:
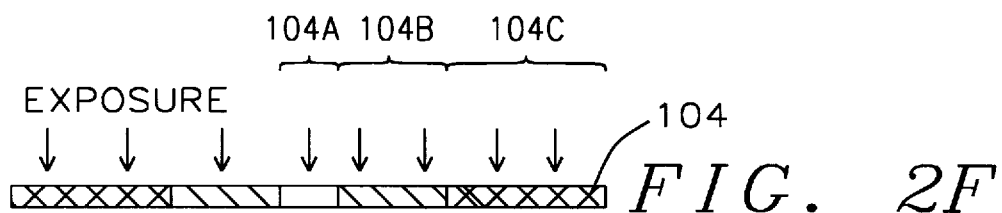
FIG. 2F is a cross sectional view of a half tone optical mask 104 used to form the first and second openings 30 34 of the present invention.
Figure 3A:
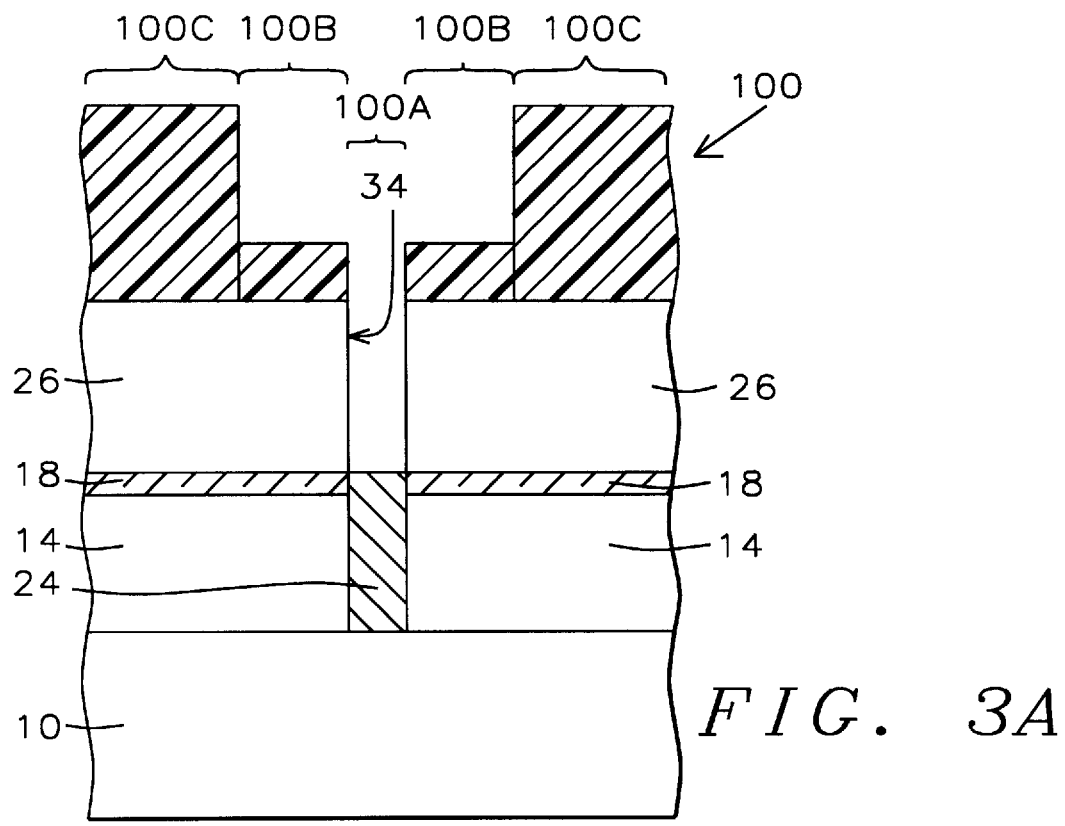
FIGS. 3A, 3B and 3C are cross sectional views for illustrating a three level photo resist layer 100 used in the third and fourth preferred methods for forming the first and second openings 30 34 for manufacturing cylindrical capacitor according to the present invention.
Figure 3B:
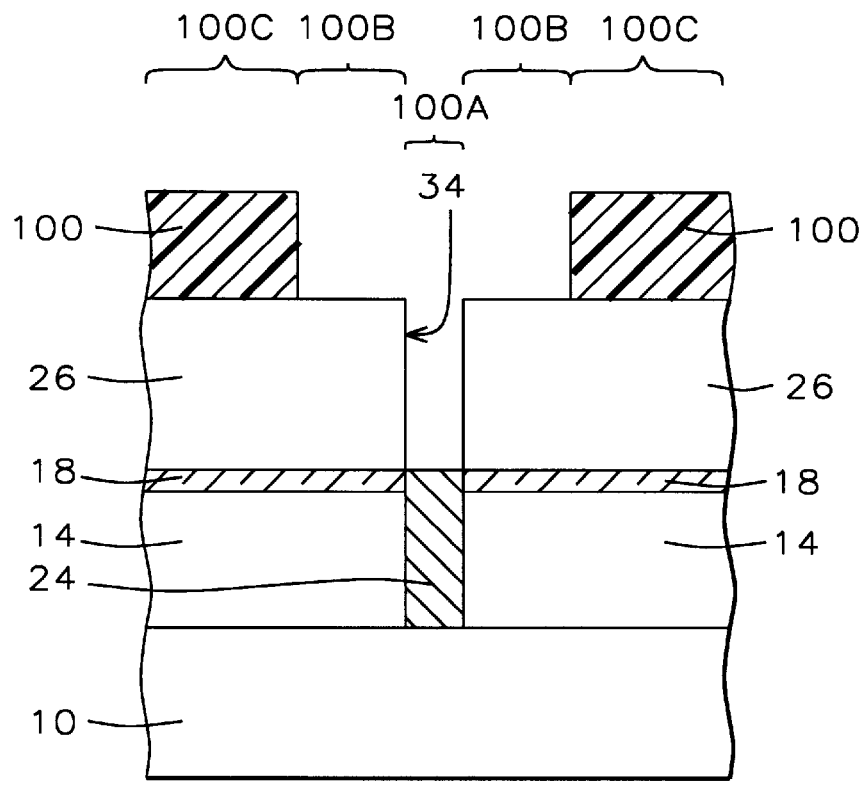
Figure 3C:
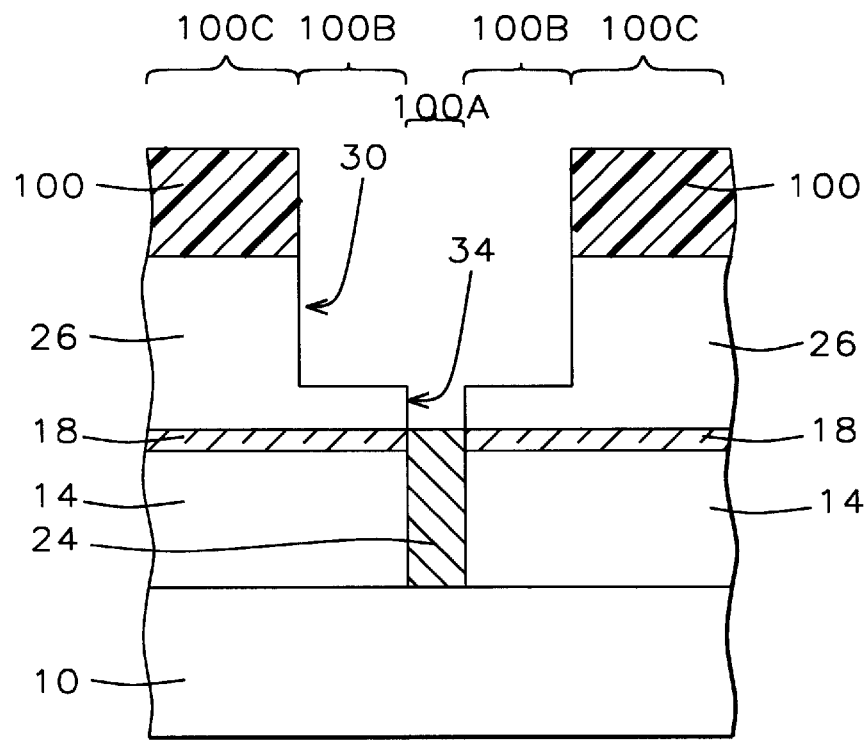
Figure 4A:
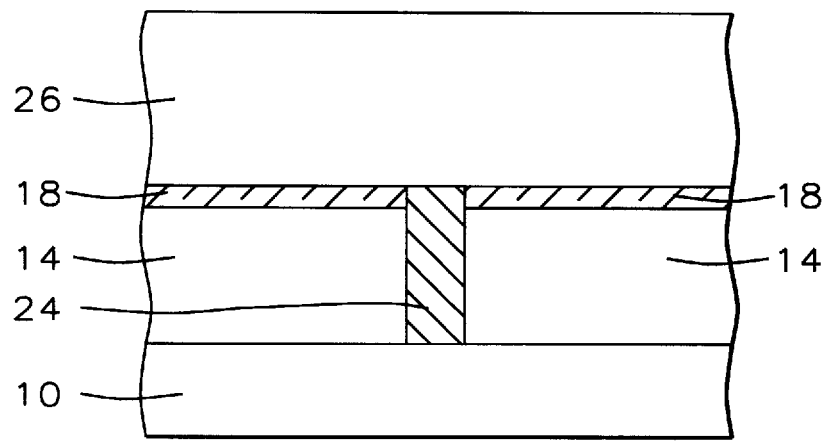
FIGS. 4A, 4B and 4C show a first preferred method for forming the first and second openings 34 30 for manufacturing cylindrical capacitor according to the present invention.
Figure 4B:
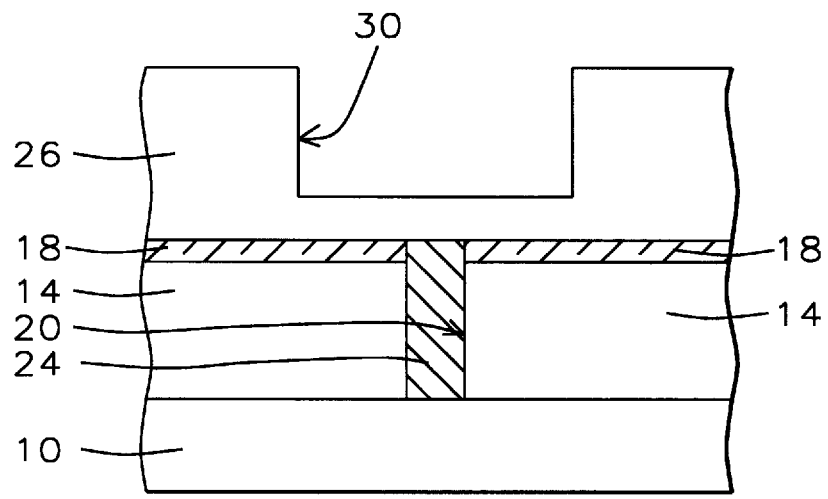
Figure 4C:
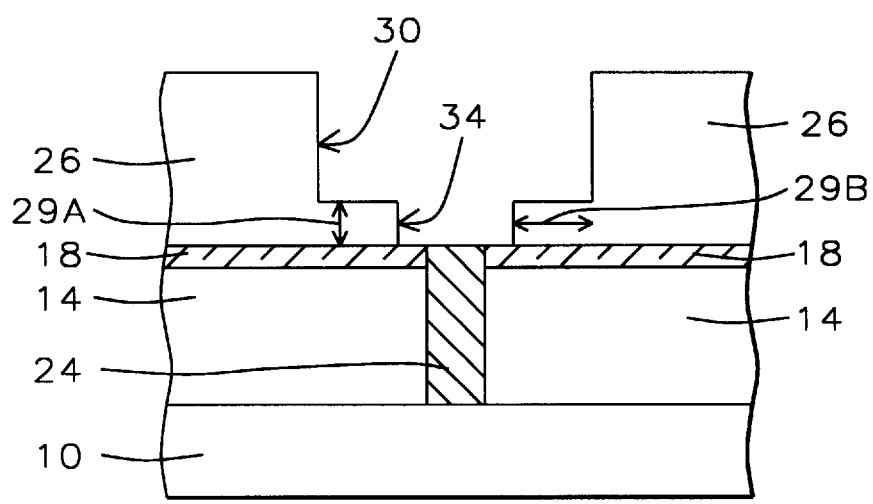
Figure 5A:
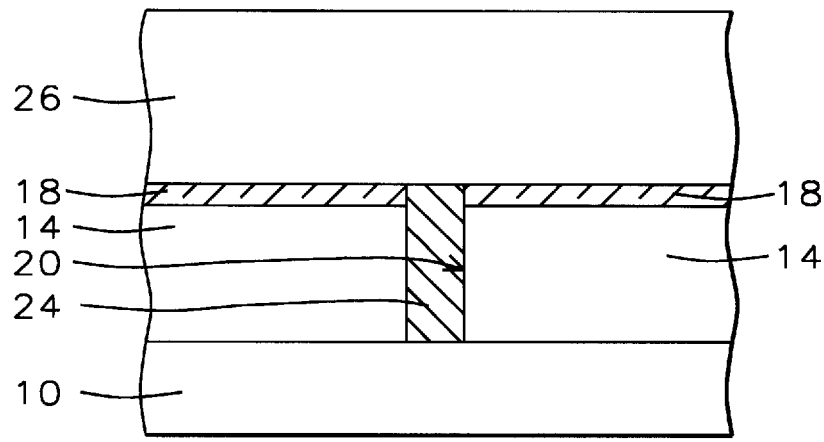
FIGS. 5A, 5B and 5C show a second preferred method for forming the first and second openings 34 30 for manufacturing cylindrical capacitor according to the present invention.
Figure 5B:
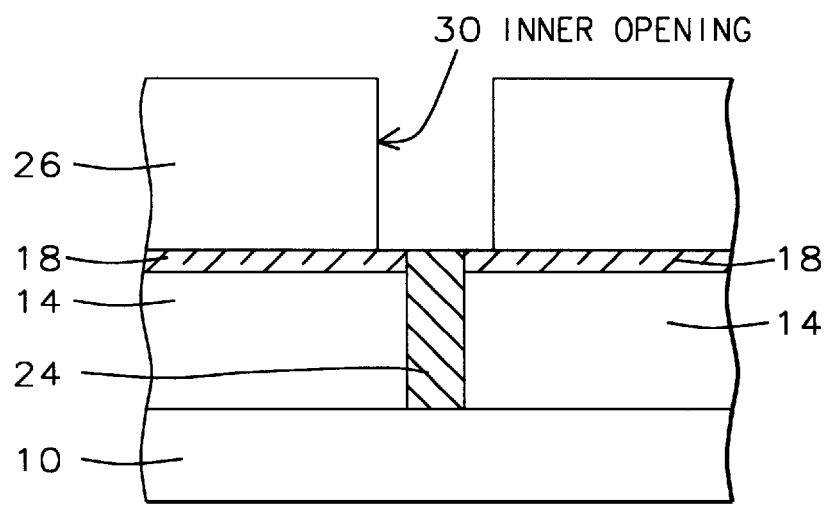
Figure 5C:
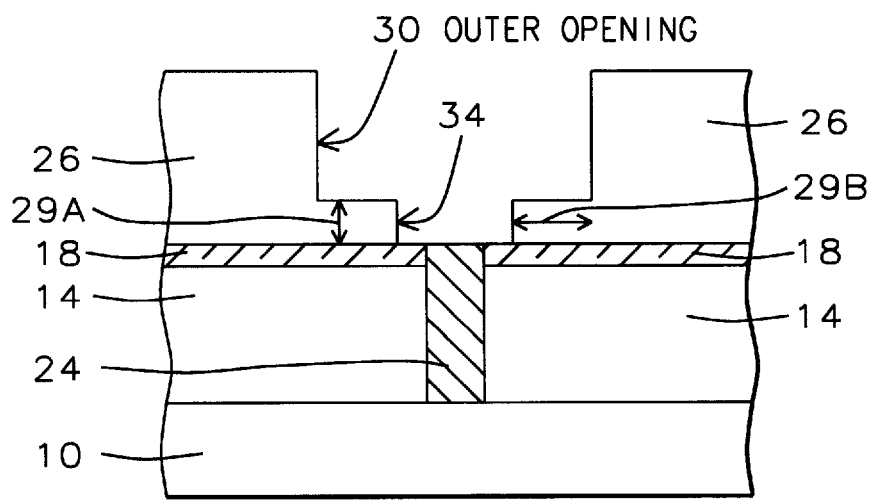

| Method | Remarks | FIGS. |
|---|---|---|
| 1 | 2 Photoresists layers - forms first (outer) opening 30 then forms second (inner) opening 34 | FIGS. 4A, 4B & 4C |
| 2 | 2 Photoresists layers - forms second (inner) opening 34 then forms first (outer) opening 30 | FIGS. 5A, 5B & 5C |
| 3 | One 3 level photoresist layer 100, half tone mask and 3 step etch process | FIGS. 2E, 2F, 3A–3C |
| 4 | One 3 level photoresist layer 100, e-beam photoresist exposure and 3 step etch process | FIGS. 3A, 3b & 3C |

Also, in all the embodiments and figures, the first opening 30 is the wider outer opening and the second opening 34 is the inner narrower opening. See e.g., FIG. 1B and 4C. This nomenclature is used regardless of the order that the first and second openings are formed.

The First Embodiment—HSG Layer Over the Inside of the Cylindrical Electrode

The first preferred embodiment of the invention is described below and shown in FIGS. 1A to 1D. The first embodiment forms the HSG layer on the inside surface of the cylindrical electrode 48A.

Figure 1A:
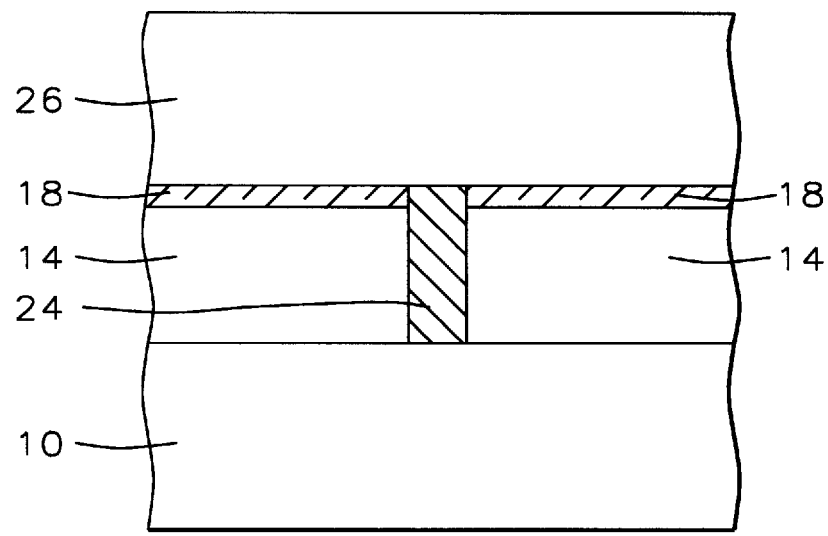
FIGS. 1A through 1D are cross sectional views for illustrating a first embodiment for manufacturing cylindrical capacitor according to the present invention.

As shown in FIG. 1A, a first insulating layer 14 is formed over the substrate 10. The substrate is understood to possibly include a semiconductor wafer, active and passive devices formed within the wafer and layers formed on the wafer surface. The term "substrate" is mean to possibly include devices formed within a semiconductor wafer and the layers overlying the wafer. The term "substrate surface" is meant to possibly include the upper most exposed layers on a semiconductor wafer, such as a silicon surface, an insulating layer and metallurgy lines.

A first barrier layer 18 is formed over the first insulating layer 14. The first barrier layer 18 is preferably composed of silicon nitride.

A contact opening 20 is formed through the first insulating layer 14 and the first barrier layer 18 exposing the substrate surface. The contact opening 20 is preferably formed by forming a photoresist layer (not shown) on the barrier layer 18 and patterning the photoresist layer using convention expose, develop and etch processes.

The contact opening 20 is then filled with a conductive material forming a plug 24. The plug is preferably filled with tungsten. The conductive material is removed from over the first barrier layer 18 preferably using a chemical-mechanical polish (CMP) or reactive ion etch (RIE) process.

Next, a second insulating layer 26 is over the first barrier layer 18. The second insulating layer is preferably formed of silicon oxide.

Figure 1B:
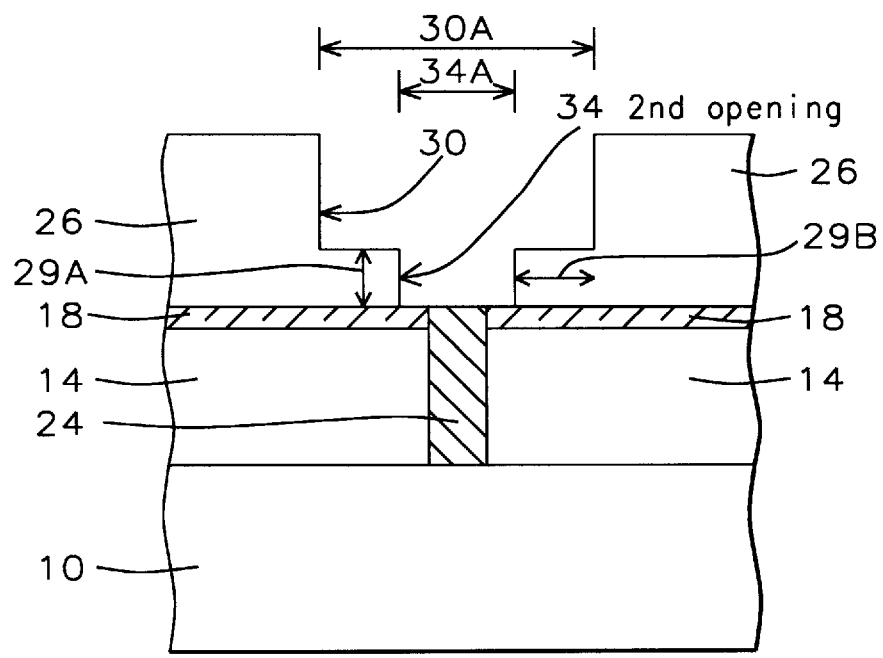

As shown in FIG. 1B, a first opening 30 (wider outer opening) and a second opening 34 (inner narrower opening) are formed in the second insulating layer. The first opening 30 is formed partially through the second insulating layer 26 at least over the plug 24. The first opening 30 has a first open dimension 30A. The second opening 34 has an open dimension 34A. The first opening 30 defined by upper sidewalls of the second insulating layer 26. The first opening 30 has a larger open dimension than the second opening 34. The second opening exposes the plug 24. The second opening 34 is formed in the second insulating layer exposing the plug 24. The second open dimension 34A is smaller than the first open dimension 30A. The second opening 34 is defined by lower sidewalls of the second insulating layer 26.

As shown in FIG. 1B, the remaining second insulating layer 26 under the second opening 34 has a thickness 29A greater than 400 Å. The width 29B of the insulating layer between the edges of the first and second openings is preferably greater than 0.1 μm. These dimensions determine the shape of the cylindrical electrode 48A shown in FIG. 1D.

The first opening 30 and second opening 34 can be formed in any of four preferred methods (e.g., options/applications). These four methods are described below. The first and second methods reverse the order of the formation of the large and small openings 30 34 in the second insulating layer 26.

First Preferred Method of Forming the First 34 and Second Openings 30

The first preferred method of forming the first 30 and second openings 34 is shown in FIGS. 4A, 4B and 4C. As shown in FIG. 4B, a first opening 30 is formed (using a first photoresist layer (not shown) as an etch mask) in the second insulating layer 26 over the plug 24. The first opening 30 has a first open dimension. The first opening 30 defined by upper sidewalls of the second insulating layer 26.

As shown in FIG. 4C, a second opening 34 is formed (using a second photoresist layer as a etch mask (not shown)) completely through the second insulating layer exposing the plug 24. The second opening 34 has a second open dimension. The second open dimension is smaller than the first open dimension. The second opening 34 is defined by lower sidewalls of the second insulating layer 26.

As shown in FIG. 4C, the remaining second insulating layer 26 under the second opening 44 has a thickness 29A greater than 400 Å. The width 29B of the insulating layer between the edges of the first and second openings is greater than 0.1 μm. These dimensions determine the shape of the cylindrical electrode shown in FIG. 1D.

The Second Preferred Method for Forming the First and Second Openings 30 34

The second preferred method for forming the first and second openings (outer and inner openings) 30 34 is shown in FIGS. 5A, 5B and 5C. The second method also uses 2 photoresist layers. FIG. 5A shows the second insulating layer 26 formed over the barrier layer.

As shown in FIG. 5B, a (narrower inner opening) second opening 34 is formed completely through the second insulating layer 26 exposing the plug 24. The inner (second) opening 34 has a second open dimension. The inner opening 34 is defined by lower sidewalls of the second insulating layer 26.

As shown in FIG. 5C, a (e.g., wider outer opening) first opening 30 is formed through a portion of the second insulating layer 26. The first (outer) opening 30 has a first (outer) open dimension. The first (outer) opening 30 is wider than the second (inner) opening 34. The outer (second) opening 30 is defined by upper sidewalls of the second insulating layer 26 as shown in FIG. 5C. The remaining second insulating layer 26 under the second opening 34 has a thickness 29A preferably greater then 400 Å. The width 29B of the insulating layer between the edges of the first and second openings is preferably greater than 0.1 µm.

The Third Method for Forming the First and Second Openings 30 34

The third and fourth preferred methods for forming the first and second openings 30 34 of the invention use only one photoresist layer to define the invention's cylindrical capacitor. Both the third and fourth embodiments form a 3 level (thickness) photoresist layer that has 3 different thickness areas, (1) full thickness 100C (2) intermediate thickness 100B and (3) no thickness 100A (open). The third method for forming the first and second openings uses a half tone optical mask to define the 3 level photoresist 100. The fourth method used e-beam to define the 3 level photoresist layer 100.

The third method for forming the first and second openings uses a half tone optical mask to define the 3 level photoresist 100. As shown in FIGS. 2E, 2F, and 3A, the third method comprises forming the photoresist layer 100 by exposing the photoresist layer 100 thorough an optical half-tone mask 104 having an opaque area 104C aligned with (corresponding to) the full thickness area (e.g., full height area) 100C of the photoresist layer 100 and a partially opaque area 104B corresponding to the intermediate thickness area (e.g., intermediate height area) 100B of the photoresist layer 100 and a transparent area 104A corresponding to the zero thickness area (no height area) 100A of the photoresist layer. FIG. 2E shows a top down view of the half tone mask. FIG. 2F shows a cross sectional view of the optical mask 104 being used to expose the photoresist layer 100. After this exposure, the photoresist layer is developed to form the 3 level photoresist mask as shown in FIG. 3A. It should be noted that a negative photoresist layer 100 and a half tone mask with the reverse image mask (not shown) can also be used.

The Fourth Preferred Method for Forming the First and Second Openings 30 34

The fourth method forms the 3 level photoresist layer 100 using an e-beam process. The method comprises forming the photoresist layer by exposing the photoresist layer to varying doses from an e-beam lithography tool. The e-beam lithography tool can be programmed to change the exposure dose so that the three photoresist areas 100A 100B and 100C receive different doses and a 3 or more level photoresist layer is formed (See FIG. 3A). Again both positive and negative photoresist can be used.

In both the third and fourth methods the 3 level photoresist 100 is used with a three step etch process to define the cylinder portion 48A of the bottom electrode.

The general method of the third and fourth methods for forming the first and second openings begins as shown in FIG. 1A by forming the first insulating layer 14, first barrier layer 18, a contact opening 20, plug 24, and second insulating layer 26, as discussed above.

As shown in FIG. 3A, in a first etch step, the second insulating layer 26 selectively etched in the zero thickness area (no height area) 100A where the photoresist layer 100 is substantially removed to form a second opening 34 (e.g., narrow inner opening) in the second insulating layer.

As shown in FIG. 3B, in a second etch step, the photoresist layer 100 is etched to remove the intermediate thickness area (e.g., intermediate height area) 100B of the photoresist.

In a third etch step as shown in FIG. 3C, the second insulating layer 26 is selectively etched in the zero thickness area (no height area) 100A and the intermediate thickness area (e.g., intermediate height area) 100B where the photoresist layer 100 is substantially removed to form a first opening 30 (e.g., wide outer opening or cylindrical opening) partially through the second insulating layer 26.

Figure 1C:
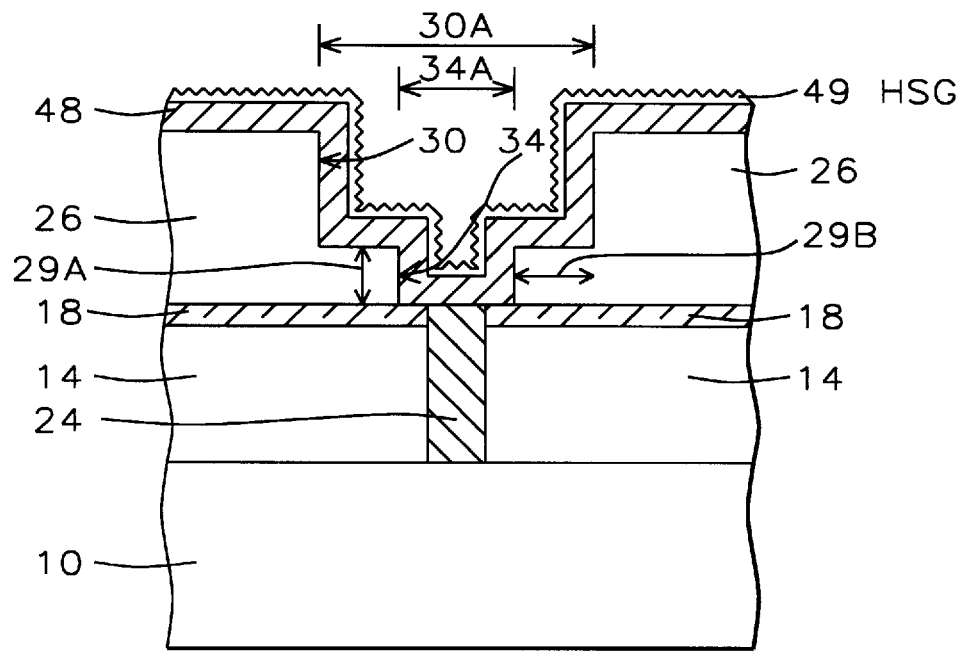

After the first and second openings 30 34 are formed using one of the four preferred methods described above, a conductive material (e.g., insitu doped polysilicon layer) 48 is formed over the second insulating layer 26. As shown in FIG. 1C, a conductive material (e.g., insitu doped polysilicon layer) 48 is formed over the exposed plug 24, over the second insulating layer, and over the sidewalls of the second insulating layer 26. The conductive material preferably comprises insitu doped polysilicon.

As shown in FIG. 1C, a hemispherical grain film (HSG) 49 is formed over the polysilicon layer 48.

Figure 1D:
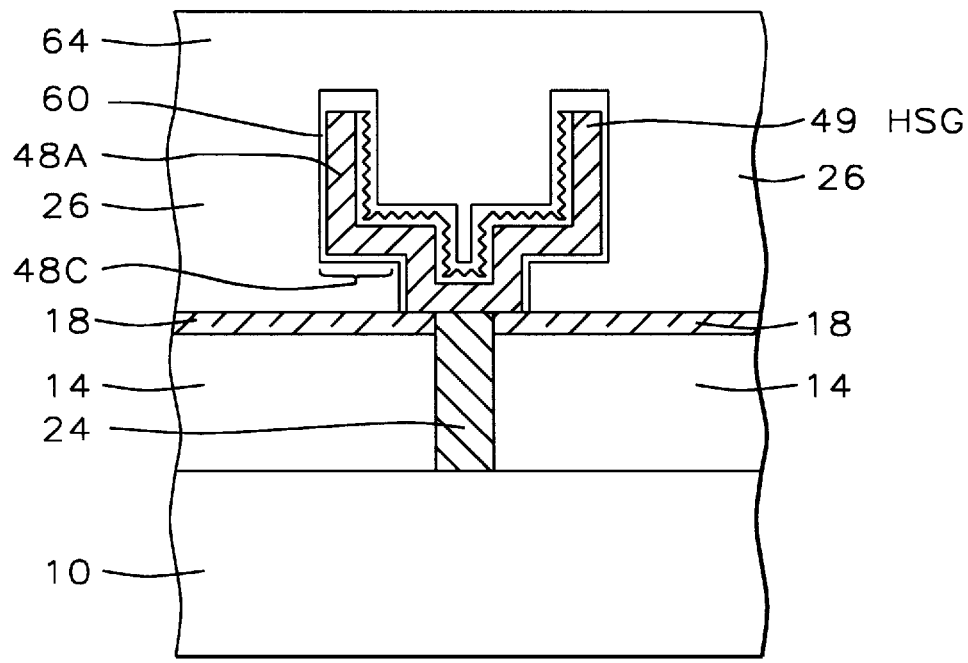

As shown in FIG. 1D, the polysilicon layer 48 and HSG layer 49 over the second insulating layer 26 is removed. The removal of the polysilicon layer 48 and HSG layer 49 performed with a chemical-mechanical polish.

As shown in FIG. 1D, the second insulating layer 26 is selectively etched and removed. This forms a cylindrical top 48A. A cylindrical bottom electrode is comprised of the cylindrical top 48A and the plug 24.

Referring to FIG. 1D, a capacitor dielectric layer 60 is formed over the cylindrical electrode top. Next, a top electrode 64 is formed over the capacitor dielectric layer 60. The top electrode is preferably composed of polysilicon or a polycide.

Second Preferred Embodiment—HSG Layer Over Inside and Outside of the Cylindrical Electrode The second preferred embodiment forms a HSG layer 72 on both the inside and outside surfaces of the electrode 70A. See FIG. 2D.

As shown in FIGS. 1A and 1B, the first insulating layer 14, first barrier layer 18, contact opening 20, plug 24, and second insulating layer 26 are formed as discussed above.

Referring to FIG. 2A, a polysilicon layer 70 is formed over the second insulating layer, over the sidewalls of the second insulating layer and over the exposed plug 24. The polysilicon layer 70 is preferably composed of insitu doped polysilicon.

Next, the polysilicon layer 70 over the second insulating layer 26 is preferably removed by a chemical-mechanical polishing process.

As shown in FIG. 2B, the second insulating layer 26 is selectively etched and removed thereby forming a cylindrical top 70A. A cylindrical bottom electrode comprised of the cylindrical top 70A and the plug 24.

Still referring to FIG. 2C, a hemispherical grain layer (HSG) 72 is depositing over both the inside and outside (all sides) the cylindrical top 70A and the first barrier layer 18.

As shown in FIG. 2D, the HSG layer 72 over the barrier layer 18 is removed preferably by a reactive ion etch.

Next, a capacitor dielectric layer 60 is formed over the cylindrical electrode top. The capacitor dielectric layer is preferably composed of silicon oxide/silicon nitride/silicon oxide layers (ONO). A top electrode 64 is formed over the capacitor dielectric layer. A passivation layer is formed over the top electrode. Additional conductive and passivation layers are formed thereover to complete the DRAM devices as is known to those skilled in the art.

The method of the present invention provides a high capacitance cylindrical capacitor. The capacitor has a higher capacitor especially because of the additional cylindrical area 48C under the upper cylinder 48A (see FIG. 1D).

The invention has four preferred methods for forming the first and second openings 30 34 in the second dielectric layer 26 that defines the cylindrical electrode 48A 70A. The first and second methods use a two mask process which is easy to manufacture. The third and fourth methods use a 3 level photoresist layer 100 and a 3 step etch process to pattern in the second dielectric layer that defines the cylindrical electrode 48A 70A. The third and fourth methods have a low cost because of the one photoresist mask photo process. The third method uses a half tone mask while the fourth method uses an e-beam method.

It should be will understood by one skilled in the art that by including additional process step not described in this embodiment, other types of devices can also be included on the DRAM chip. For example, P wells in the P substrate and CMOS circuit can be formed therefrom. It should also be understood that the figures depict only one capacitor/DRAM storage cell out of a multitude of cells that are fabricated simultaneously on the substrate. Also, the capacitor can be used in other chip types in addition to DRAM chips.

While the invention has been particularly shown and described with reference to the preferred embodiments thereof, it will be understood by those skilled in the art that various changes in form and details may be made without departing from the spirit and scope of the invention.

What is claimed is:

1. A method of fabrication of a capacitor having a hemispherical grain layer over the inner surface of a cylindrical electrode, comprising the steps of:

a) forming first insulating layer over a substrate;

b) chemical-mechanical polishing said first insulating layer for global planarization;

c) forming a first barrier layer composed of silicon nitride over said first insulating layer;

d) forming a contact opening through said first insulating layer and said first barrier layer exposing said substrate;

e) filling said contact opening and covering said first barrier layer with a conductive material;

f) removing said conductive material over said first barrier layer forming a plug in said contact opening; the removal of said conductive material performed using a chemical-mechanical polishing process;

g) forming a second insulating layer composed of an oxide over said first barrier layer; said second insulating layer having a top surface;

h) forming a first opening and a second opening in said second insulating layer, said first opening having a larger open dimension than said second opening; said second opening exposing said plug;

i) forming a polysilicon layer on said top surface of said second insulating layer, on said second insulating layer in said first and second openings, and over said plug; said polysilicon layer composed of insitu doped polysilicon;

j) forming a hemispherical grain film over said polysilicon layer;

k) removing said polysilicon layer and said hemispherical grain film over said top surface of said second insulating layer; said removal of said polysilicon layer performed with a chemical-mechanical polishing process;

l) selectively etching and removing said second insulating layer thereby forming a cylindrical top; a cylindrical bottom electrode is comprised of said cylindrical top and said plug;

m) forming a capacitor dielectric layer over said cylindrical top; and n) forming a top electrode over said capacitor dielectric layer.

2. The method of claim 1 wherein said conductive material comprises a insitu doped polysilicon.

3. The method of claim 1 which further includes forming said first and second openings using a two photoresist mask process by:

a) forming said first opening partially through said second insulating layer over said plug; said first opening having a first open dimension; said first opening defined by upper sidewalls of said second insulating layer; said first opening defined by a first photoresist layer;

b) forming a second opening exposing said plug; said second opening having a second open dimension; said second open dimension less than said first open dimension; said second openings defined by lower sidewalls of said second insulating layer; said second opening defined by a second photoresist layer.

4. The method of claim 1 which further includes forming said first and second openings using a two photoresist mask process by:

a) forming said second opening in said second insulating layer exposing said plug; said second opening defined by a second photoresist layer;

b) forming a first opening partially through said second insulating layer; said first opening being wider than said second opening; said first opening defined by a first photoresist layer.

5. The method of claim 1 which further includes forming said first and second openings using a one photoresist layer with three thickness levels by:

a) forming a photoresist layer having a zero thickness area, an intermediate thickness area and a full thickness area; said photoresist layer formed by a process selected from the group consisting of e-beam exposure and half-tone optical mask exposure;

b) in a first etch step, selectively etching said second insulating layer in said zero thickness area where said photoresist layer is substantially removed to form said first opening in said second insulating layer;

c) in a second etch step, selectively etching to remove said intermediate thickness area of said photoresist layer;

d) in a third etch step, selectively etching said second insulating layer in said zero thickness area and said intermediate thickness area where said photoresist layer is substantially removed to form a first opening partially through said second insulating layer.

6. A method of fabrication of a capacitor having an hemispherical grain film over the both the inner and outer surfaces of a cylindrical electrode, comprising the steps of:

a) forming first insulating layer over said substrate;

b) chemical-mechanical polishing said first insulating layer for global planarization;

c) forming a first barrier layer composed of silicon nitride over said first insulating layer;

d) forming a contact opening through said first insulating layer and said first barrier layer exposing said substrate;

e) filling said contact opening and covering said first barrier layer with a conductive material comprising insitu doped polysilicon;

f) removing said conductive material over said first barrier layer forming a plug in said contact opening; the removal of said conductive material performed using a chemical-mechanical polishing process;

g) forming a second insulating layer composed of an oxide over said first barrier layer; said second insulating layer having a top surface;

h) forming a first opening and a second opening in said second insulating layer, said first opening having a larger open dimension than said second opening; said second opening exposing said plug;

i) forming a polysilicon layer on said top surface of said second insulating layer, on said second insulating layer in said first opening and said second opening, and over said plug; said polysilicon layer composed of insitu doped polysilicon;

j) chemical-mechanical polishing and removing said polysilicon layer on said top surface of said second insulating layer;

k) selectively etching and removing said second insulating layer thereby forming a cylindrical top; a cylindrical bottom electrode is comprised of said cylindrical top and said plug;

l) depositing a hemispherical grain layer over said cylindrical top and over said first barrier layer;

m) reactive ion etching said hemispherical grain layer removing said hemispherical grain layer over said first barrier layer;

n) forming a capacitor dielectric layer over said cylindrical top;

o) forming a top electrode at least over said capacitor dielectric layer.

7. The method of claim 6 which further includes forming said first and second openings using a two photoresist mask process by:

a) forming said first opening partially through said second insulating layer over said plug; said first opening having a first open dimension; said first opening defined by upper sidewalls of said second insulating layer; said first opening defined by a first photoresist layer;

b) forming said second opening exposing said plug; said second opening having a second open dimension; said second open dimension less than said first open dimension; said second openings defined by lower sidewalls of said second insulating layer; said second opening defined by a second photoresist layer.

8. The method of claim 6 which further includes forming said first and second openings using a two photoresist mask process by:

a) forming said second opening in said second insulating layer exposing said plug; said second opening defined by a second photoresist layer;

b) forming said first opening partially through said second insulating layer; said first opening being wider than said second opening; said first opening defined by a first photoresist layer.

9. The method of claim 6 which further includes forming said first and second openings using one photoresist layer with three thickness levels by:

a) forming a photoresist layer having a zero thickness area, an intermediate thickness area and a full thickness area; said photoresist layer formed by a process selected from the group consisting of e-beam exposure and half-tone optical mask exposure;

b) in a first etch step, selectively etching said second insulating layer in said zero thickness area where said photoresist layer is substantially removed to form said second opening in said second insulating layer;

c) in a second etch step, selectively etching to remove said intermediate thickness area of said photoresist layer;

d) in a third etch step, selectively etching said second insulating layer in said zero thickness area and said intermediate thickness area where said photoresist layer is substantially removed to form a first opening partially through said second insulating layer.

10. A method of fabrication of a capacitor having an hemispherical grain layer over the inner surface of a cylindrical electrode, comprising the steps of:

a) forming first insulating layer over a substrate;

b) chemical-mechanical polishing said first insulating layer for global planarization;

c) forming a first barrier layer composed of silicon nitride over said first insulating layer;

d) forming a contact opening through said first insulating layer and said first barrier layer exposing said substrate;

e) filling said contact opening and covering said first barrier layer with a conductive material comprising insitu doped polysilicon;

f) removing said conductive material over said first barrier layer forming a plug in said contact opening; the removal of said conductive material performed using a process chemical-mechanical polishing process;

g) forming a second insulating layer composed of an oxide over said first barrier layer; said second insulating layer having a top surface;

h) forming a first opening and a second opening in said second insulating layer, said first opening having a larger open dimension than said second opening; said second opening exposing said plug; forming said first and second openings using a one photoresist layer with three thickness levels by:

i) forming a photoresist layer having a zero thickness area, an intermediate thickness area and a full thickness area; said photoresist layer formed by a process selected from the group consisting of e-beam exposure and half-tone optical mask exposure;

j) in a first etch step, selectively etching said second insulating layer in said zero thickness area where said photoresist layer is substantially removed to form said second opening in said second insulating layer;

k) in a second etch step, selectively etching to remove said intermediate thickness area of said photoresist layer;

l) in a third etch step, selectively etching said second insulating layer in said zero thickness area and said intermediate thickness area where said photoresist layer is substantially removed to form a first opening partially through said second insulating layer;

m) forming a polysilicon layer over said top surface of said second insulating layer, on said second insulating layer defining said first and second openings, and over said plug; said polysilicon layer composed of insitu doped polysilicon;

n) forming a hemispherical grain film over said polysilicon layer;

o) removing said polysilicon layer over said top surface of said second insulating layer; said removal of said polysilicon layer performed with a chemical-mechanical polishing process;

p) selectively etching and removing said second insulating layer thereby forming a cylindrical top; a cylindrical bottom electrode is comprised of said cylindrical top and said plug;

q) forming a capacitor dielectric layer over said cylindrical top; and r) forming a top electrode over said capacitor dielectric layer.

* * * * *